US006875030B2

(12) United States Patent
Oda et al.

(10) Patent No.: US 6,875,030 B2
(45) Date of Patent: Apr. 5, 2005

(54) ELECTRICAL CONNECTOR BOX WITH CUSTOMIZABLE BUS BAR CIRCUIT ASSEMBLY

(75) Inventors: Akihiro Oda, Yokkaichi (JP); Hirokazu Ito, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 10/638,317

(22) Filed: Aug. 12, 2003

(65) Prior Publication Data

US 2004/0058570 A1 Mar. 25, 2004

(30) Foreign Application Priority Data

Aug. 12, 2002 (JP) ....................................... 2002-235182

(51) Int. Cl.[7] ........................... H01R 12/00; H05K 1/00
(52) U.S. Cl. ....................................... 439/76.2; 439/949
(58) Field of Search ................................ 439/76.2, 949, 439/189

(56) References Cited

U.S. PATENT DOCUMENTS 3,648,115 A * 3/1972 Teagno ........................ 337/211
5,007,888 A * 4/1991 Goutiere ...................... 439/189
5,540,602 A 7/1996 Bell ........................... 439/721
5,626,492 A * 5/1997 Onizuka et al. ............ 439/512
5,683,257 A * 11/1997 Kobayashi et al. ........ 439/76.2
5,715,135 A * 2/1998 Brussalis et al. ........... 361/624
5,782,652 A 7/1998 Feher et al. ................ 439/417

FOREIGN PATENT DOCUMENTS

JP 61277180 12/1986 ........... H01R/31/02
JP 7184311 7/1995 ............ H01R/4/24

OTHER PUBLICATIONS

English Language Abstract of JP Appln, No. 7–184311.

* cited by examiner

*Primary Examiner*—Hae Moon Hyeon
(74) *Attorney, Agent, or Firm*—Greenblum & Bernstein, P.L.C.

(57) ABSTRACT

An electrical connector box includes first bus bars arranged in one direction, each first bus bar having first connector bands, several pairs of pinch prongs respectively extending therefrom, and first separator portions each forming a circuit connection pattern by being removed from between a pair of first connector bands. Also included are second bus bars arranged in a direction orthogonal to the arrangement direction of the first bus bars, each second bus bar having second connector bands for frictional insertion between respective pairs of pinch prongs, second terminals extending from the second connector bands, and second separator portions each forming a circuit connection pattern by being removed from between a pair of respective second connector bands. A lower case has first lower slots respectively accepting the first bus bars, and an upper case connects over the lower case, and has open plug-in apertures.

7 Claims, 9 Drawing Sheets

PRIOR ART

ELECTRICAL CONNECTOR BOX WITH CUSTOMIZABLE BUS BAR CIRCUIT ASSEMBLY

CROSS-REFERENCE TO RELATED APPLICATION

The present application claims priority under 35 U.S.C. § 119 of Japanese Patent Application No. 2002-235182, filed on Aug. 12, 2002, the disclosure of which is expressly incorporated by reference herein in its entirety.

BACKGROUND OF THE INVENTION

1. Field of Invention

The present invention relates to an automotive electrical connector box, and more particularly, to an electrical box configured to join electrical circuits through an easily changeable circuit connecting structure.

2. Description of Related Art

A conventional connector box is exemplified by Japanese Laid-Open Patent Publication No. 61-277180, and is shown in FIG. 9. In this conventional connector box, bus bars 2 are fixedly installed within floored housing 1 with bus bar spade terminals 2*a* extending toward the open side of the housing 1. Plug-in block 3, which houses female connector terminals joined to wire ends, is removably inserted to housing 1 so as to join the female connector terminals to spade terminals 2*a*, and thus connect the wires held within plug-in block 3 through the bus bars 2.

This type of conventional connector box requires that the wires for connection be inserted and anchored within the plug-in block during the assembly process. This structure restricts the freedom with which wiring connection patterns can be designed, often requires that long lengths of wire be routed to the plug-in block, and does not allow the wires in the plug-in block to be easily changed when the wire connection pattern is to be altered.

Furthermore, as the connector box is structured to accept only a single type of plug-in block, the circuit connection is limited to the wires that are already attached to the plug-in block. As a result, the wiring harness must be designed to incorporate a large number of connector boxes, a factor that contributes to unnecessary complexity in the wiring harness assembly process.

SUMMARY OF THE INVENTION

The invention, in consideration of the aforesaid shortcomings, provides a structure for a connector box that easily accommodates changes in circuit connection patterns, thus eliminating the need to incorporate a large number of connector boxes in the wiring harness, and thus simplifying the wiring harness assembly process.

To resolve the aforesaid shortcomings, the invention provides an electrical connector box having multiple first bus bars, each incorporating pinch prongs extending at generally uniform intervals from a connector band, and multiple second bus bars, each incorporating second terminals extending at generally uniform intervals from a connector band.

An interconnected structure is formed by arranging the first bus bars at generally uniform internals generally along a 'Y' axis direction, arranging the second bus bars at generally uniform intervals generally along an 'X' axis direction, and frictionally inserting the second bus bar connector bands between the aforesaid first bus bar pinch prongs.

Separator parts may be employed to sever specific portions of the first and second bus bar connector bands.

The mutually joined first and second bus bar assembly is enclosed within lower and upper cases with the first bus bars inserted into slots formed on the floor of the lower case, thus forming a structure in which second bus bar terminals extend into one end of vertically aligned open-ended plug-in apertures formed within the upper case.

Plug-in blocks, which contain connector terminals attached to wire ends extending therefrom, are inserted into the plug-in apertures to connect the connector terminals to the second bus bar terminals.

The frictionally-joined first and second bus bars form a grid in which the second bus bar terminals, which are aligned in rows on both 'X' and 'Y' axes, may be connected in any desired pattern. Various circuit connection patterns can be freely established on the 'Y' axis of the grid by removing separators of the second terminals on the second bus bar connector band, and various circuit connecting patterns can be freely established on the 'X' axis of the grid by specifically removing separators of the second bus bar terminals and the first bus bar pinch prongs.

Inserting the plug-in blocks into the vertically aligned plug-in apertures in the upper case results in the wire terminals in the plug-in block making electrical connection with the second bus bar terminals in the plug-in apertures, thus establishing a connection between wires in the same plug-in block, or between wires from different plug-in blocks.

This structure therefore eliminates the need for specific attachment of wires to the plug-in block beforehand, and also eliminates the need to change wires in the plug-in block to establish a newly-required circuit connection pattern. In other words, circuit connection patterns can be easily altered by separating specific portions of the bus bars without changing the wires in the plug-in blocks.

The invention provides an electrical connector box in which selectively connectable first and second bus bars and vertical and horizontal rows of terminals are housed within lower and upper cases (case housing). Because the structure incorporates an upper case into which a group of plug-in blocks can be inserted, a single connector box is able to fulfill the role of the multiple dispersed connector boxes that have been heretofore required to make connections within a wiring harness.

Therefore, as a result of all required circuit connections being made within a single connector box, the necessity of previously arranging and inserting wires in the plug-in block is eliminated, wires can be inserted into any plug-in block beforehand without specific positional requirements, wire lengths can be shortened, and the circuit connecting pattern can be easily changed.

Furthermore, because multiple plug-in blocks may be sequentially inserted into the upper case before inserting the upper case into the lower case, insertion of the plug-in blocks into the upper case requires less force. Also, the circuit connection pattern can be easily modified by changing the position of the plug-in block in the upper case.

The connector box is assembled by frictionally inserted the first bus bars into slots on the lower case floor after which the second bus bars are frictionally joined to the first bus bar pinch prongs, and the upper case inserted into and locked to the lower case. As an alternate method, the first and second bus bars may be mutually joined and then inserted into the lower case.

Vertically aligned plug-in apertures are formed in the upper case, and lock grooves are formed on the inner surface of both sidewalls of each plug-in aperture. Lock pawls, which are formed on both sides of each plug-in block, connect to the aforesaid lock grooves as a way of locking the plug-in block within the aperture, thus electrically connecting and securing the terminals in the wire-holding plug-in block to the second bus bar terminals in the plug-in aperture.

The depth dimension of the lower and upper case assembly is relatively large as a result of the connector band of the second bus bar being inserted into the slots between protruding pinch prongs that extend from the connector band of the first bus bar, and the length of the second terminals extending from the second bus bar connector band. The depth dimension is also increased as a result of the extending part of the first bus bar connector bands that inserts into the slots in the lower case. The result of these structures is that the electrical connector box, which is an assembly of the first and second bus bars and lower and upper cases, has relatively large external dimensions.

To reduce the depth dimension of the electrical connector box, slots may be formed on the end of the second bus bar connector band opposite and adjacent to the terminals. The first bus bar pinch prongs can thus be inserted past the aforesaid slots to reduce the extension of the second bus bar from the first bus bar an amount equivalent to the depth of the slots.

Moreover, the first bus bar connector band can be bent to reduce the distance that the second bus bar extends from the first bus bar, the amount of reduction being generally equivalent to the length of the bent part. As a result of this structure, the depth of the first and second bus bar assembly is only minimally larger than the width of the second bus bars, thus allowing the electrical connector box to be made to considerably smaller external dimensions.

The present invention provides an electrical connector box having a plurality of first bus bars generally uniformly arranged at intervals in a Y axis direction, each bus bar having a plurality of first connector bands, a plurality of pairs of pinch prongs respectively extending at generally uniform intervals from the plurality of first connector bands, and a plurality of first separator portions each configured to form a circuit connection pattern by being removed from between a pair of first connector bands. Also provided is a plurality of second bus bars generally uniformly arranged at intervals in an X axis direction, each bus bar having a plurality of second connector bands configured to be frictionally inserted between a respective plurality of pairs of pinch prongs and form a bus bar assembly, a plurality of second terminals respectively extending at generally uniform intervals from the plurality of second connector bands, and a plurality of second separator portions each configured to form a circuit connection pattern by being removed from between a pair of respective second connector bands. Also provided is a lower case having a plurality of first lower slots formed in a floor of the lower case, the plurality of first lower slots configured to respectively accept the plurality of first bus bars, and an upper case configured to connect over the lower case, the upper case having a plurality of open plug-in apertures each configured to allow a plurality of second terminals of a second bus bar to extend into a plug-in aperture, the upper case and the lower case configured to accommodate the bus bar assembly when the upper case and the lower case is connected together. Each plug-in aperture is further configured to connectingly accommodate a plug-in block having a plurality of connector terminals attached to ends of a respective plurality of wires such that the plurality of connector terminals respectively connect to the plurality second terminals.

According to another feature of the invention, the plurality of second connector bands has a respective plurality of second slots respectively formed on ends opposite the plurality of second terminals, the second slots configured to be inserted between a respective plurality of pairs of pinch prongs and form the bus bar assembly, and in the bus bar assembly, the plurality of pairs of pinch prongs respectively extend beyond the plurality of second slots.

According to a further feature of the invention, the first connector bands may be bent, and in the bus bar assembly, the plurality of second bus bar connector bands respectively engage the bent plurality of first connector bands.

According to an additional feature of the invention, the lower case has a plurality of second lower slots configured to respectively accept the plurality of second bus bars.

Also provided is a method of assembling an electrical connector box, the method including, in no particular order, generally uniformly arranging a plurality of first bus bars at intervals in a Y axis direction, each bus bar of the plurality of first bus bars having a plurality of first connector bands and a plurality of pairs of pinch prongs respectively extending at generally uniform intervals from the plurality of first connector bands, forming a circuit connection pattern by removing at least one of a plurality of first separator portions from between a pair of first connector bands of the plurality of first connector bands, generally uniformly arranging a plurality of second bus bars at intervals in an X axis direction, each bus bar of the plurality of second bus bars having a plurality of second connector bands and a plurality of second terminals respectively extending at generally uniform intervals from the plurality of second connector bands, forming a circuit connection pattern by removing at least one of a plurality of second separator portions from between a pair of respective second connector bands of the plurality of second connector bands, forming a bus bar assembly by frictionally inserting the plurality of second connector bands between a respective plurality of pairs of pinch prongs, inserting the plurality of first bus bars into a respective plurality of first lower slots formed in a floor of a lower case, and assembling an upper case over with the lower case to form a case housing, the upper case having a plurality of open plug-in apertures, such that one of the plurality of second terminals of a second bus bar of the plurality of bus bars to extend into a plug-in aperture of the plurality of plug-in apertures, the case housing accommodating the bus bar assembly.

Another aspect of the method of the invention may include connecting a plug-in block to a plug-in aperture, the plug-in block having a plurality of connector terminals attached to ends of a respective plurality of wires, such that the plurality of connector terminals respectively connect to the plurality second terminals.

A further aspect of the method may include inserting the plurality of second bus bars into a respective plurality of second lower slots formed in the floor of the lower case.

In an additional feature of the invention the forming of a bus bar assembly may further include inserting a respective plurality of second slots, respectively formed on ends opposite the plurality of second terminals, between a respective plurality of pairs of pinch prongs, and respectively extending the plurality of pairs of pinch prongs beyond the plurality of second slots.

Yet another aspect of the invention may include bending the plurality of first connector bands such that in the bus bar assembly, the plurality of second bus bar connector bands respectively engaging the bent plurality of first connector bands.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION OF THE INVENTION

Figure 1:
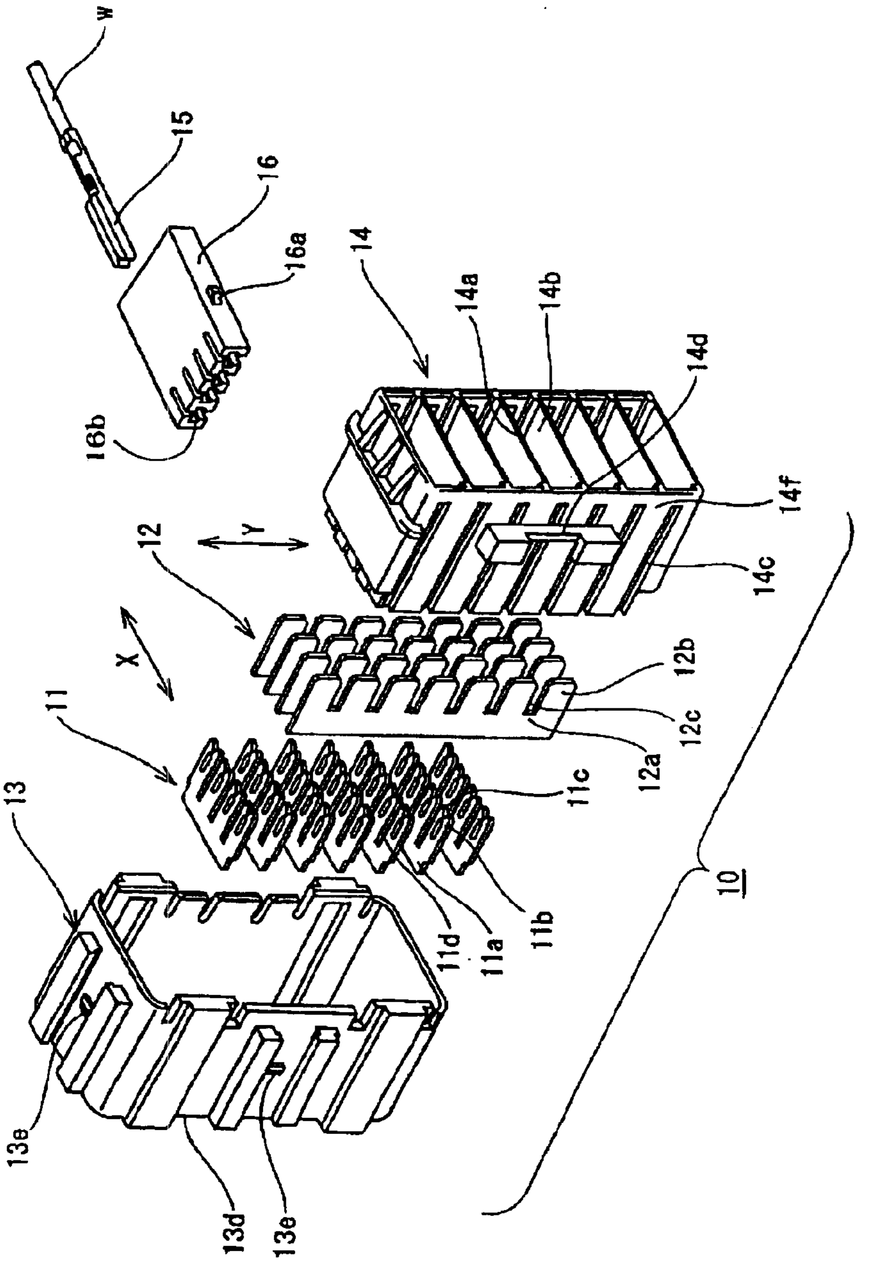
FIG. 1 is an exploded perspective view of a first embodiment of a connector box according to the present invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

An embodiment of the electrical connector box, as described by the invention, will be explained with reference to the attached drawings wherein like characters represent like elements. FIGS. 1, 2A, 2B, 3 and 4A–4C illustrate a first embodiment of the connector box invention in the form of connector box 10 which is assembled from multiple first bus bars 11, multiple second bus bars 12, lower case 13, and upper case 14. Upper case 14 is structured to accommodate the insertion of multiple plug-in blocks 16, each plug-in block 16 containing terminals 15 that are attached to the terminal ends of wires "w."

Figure 2A:
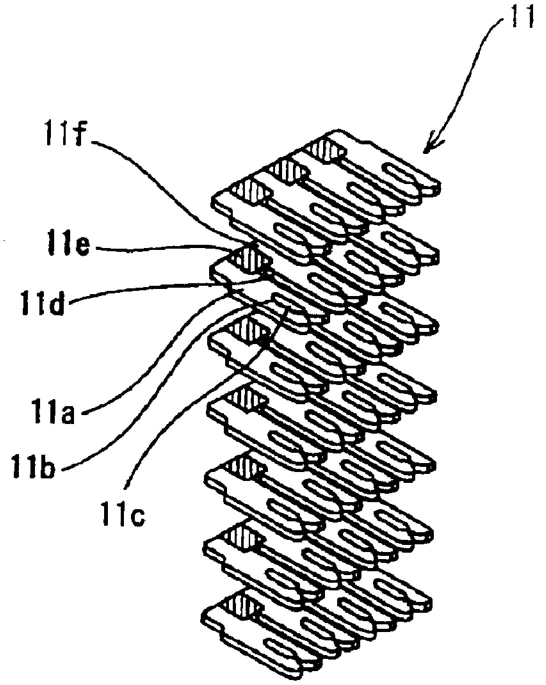
FIG. 2A is a perspective view of the separated parts of a first bus bar of the present invention.

First bus bar 11 incorporates pinch slots 11_c_ which are defined by pinch prongs 11_b_, the pinch slots 11_c_ extending along one side of connector band 11_a_ at generally uniform intervals. As shown in FIG. 2A, a circuit connection structure may be severed by separators 11_e_ which are located opposite pinch slots 11_d_ at the other side of connector band 11_a_. The end of connector band 11_a_ where the separators 11_e_ are provided includes insert part 11_f_ which is configured to be frictionally inserted into lower case 13.

Figure 2B:
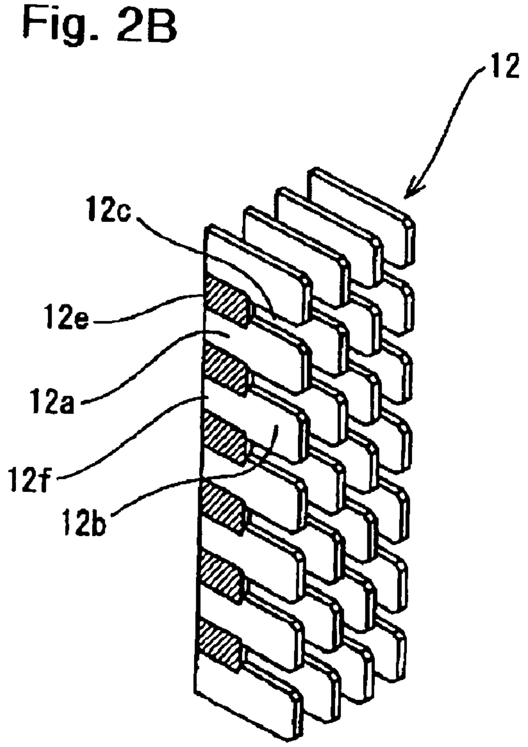
FIG. 2B is a perspective view of the separated parts of the second bus bar of the present invention.

Second bus bar 12 incorporates terminals 12_b_ that extend at generally uniform intervals along one side of connector band 12_a_. As shown in FIG. 2B, a circuit connection can be severed by the installation of separators 12_e_ which are located at the other side of connector band 12_a_ at the ends of slots 12_c_ between terminals 12_b_. The side of connector band 12_a_ to which separators 12_e_ are attached includes insert parts 12_f_ which are frictionally inserted between pinch slots 11_c_ of first bus bar 11.

As shown in FIG. 1, first and second bus bars 11 and 12 mutually cross connect to form a grid-like framework. Specifically, pinch prongs 11_b_ (of the first bus bars 11) protrude at generally uniform intervals and are aligned along the X axis direction (i.e., the horizontal direction in FIG. 1). The first bus bars 11 themselves are spaced at generally uniform intervals along the Y axis direction (i.e., the vertical direction in FIG. 1). Terminals 12_b_ (of the second bus bars 12) protrude at generally uniform intervals and are aligned along the Y axis direction. The second bus bars 12 themselves are spaced at generally uniform intervals along the X axis direction.

As shown in FIG. 2B, insert parts 12_f_, which are part of second bus bar connector band 12_a_, are configured to be frictionally inserted into corresponding pinch slots 11_c_. In this embodiment, first bus bar pinch prongs 11_b_ frictionally grip second bus bar connector band 12_a_ at the base of terminals 12_b_.

As long as there is frictional contact between all first and second bus bars 11 and 12, all second terminals 12_b_ are in a state of mutual electrical connection, providing that portions of the bus bars 11, 12 have not been separated. The separation (i.e., removal) of certain portions of first and/or second bus bars 11,12, respectively, before the bus bars are joined, allows any combination of second terminals 12_b_ to be freely connected on the X-Y axes.

Figure 3:
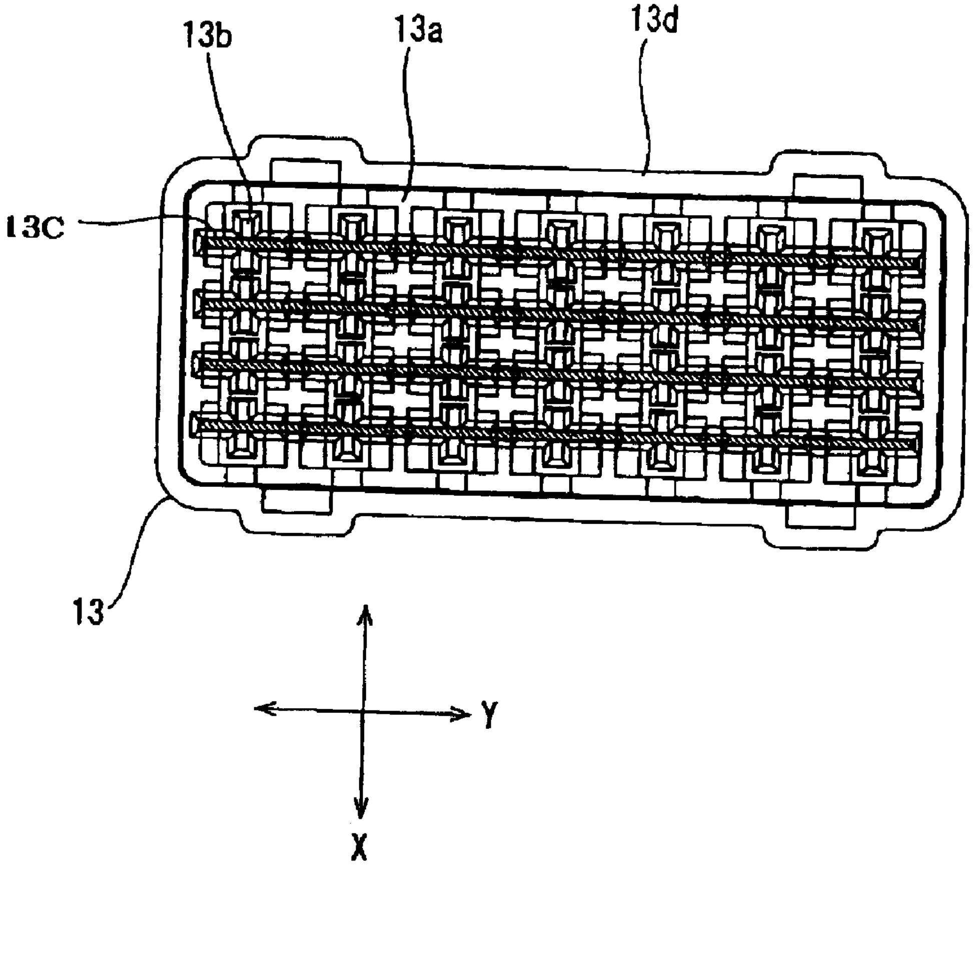
FIG. 3 is a front view of the bus bars attached to the lower case of the present invention.

As illustrated in FIG. 3, floor 13_a_ covers one end of lower case 13, and friction insertion slots 13_b_, which are oriented along the X-axis, are formed in the upper side of floor 13_a_ (i.e., on the inside of the case) as a way of securing first bus bar insert parts 11_f_ in the lower case 13. Slots 13_c_, which are oriented along the Y axis, intersect slots 13_b_ within the floor 13_a_, and function as spaces to accommodate the insertion of second bus bar connector bands 12_a_. External wall 13_d_ is formed to a height that encloses mutually joined first and second bus bars 11 and 12 (i.e., a bus bar assembly). Lock tab 13_e_ is formed on the external surface of lower case 13.

Divider walls 14_a_ are present in upper case 14 between the internally facing surfaces of walls 14_f_ at specific intervals in the vertical direction (Y axis), thereby forming plug-in apertures 14_b_ as a series of vertically-aligned compartments. There are seven plug-in apertures 14_b_ in this first embodiment, but it is readily appreciable by those skilled in the art that greater or fewer than seven plug-in apertures 14*b* may be used in alternative embodiments. Lock channels 14*c,* which are formed within an outer surface of the divider wall 14*a* at the regions where the wall defines each plug-in aperture 14*b,* form a locked joint with lock fingers 16*a* of plug-in block 16, upon the insertion of plug-in block 16. Furthermore, lock boss 14*d,* which is provided on the outer surface of the divider wall 14*a,* forms a locked joint with lower case lock tab 13*e*.

Plug-in block 16, which is configured for insertion into a respective plug-in aperture 14*b* in upper case 14, is a single-row multi-connector terminal block containing multiple terminal receptacles 16*b* that are arranged horizontally (i.e., along the X axis). While the illustrated embodiment shows four terminal receptacles 16*b*, it is readily appreciable by those skilled in the art that greater or fewer than four terminal receptacles 16*b* may be used in alternative embodiments. A connector terminal 15 is crimped to each wiring harness branch wire 'w' (not shown), and anchored within terminal receptacle 16*b*.

Figure 4A:
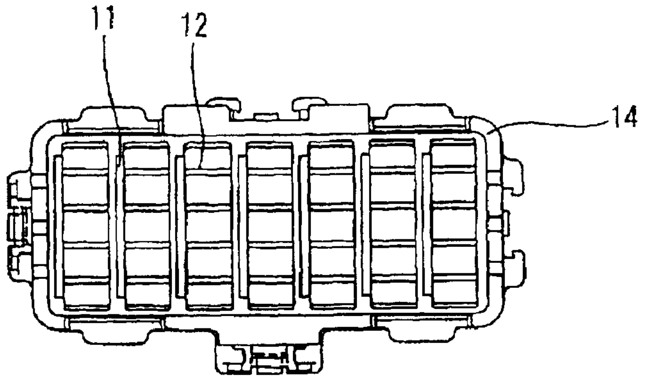
FIG. 4A is a front view of the assembled connector box of the present invention.
Figure 4B:
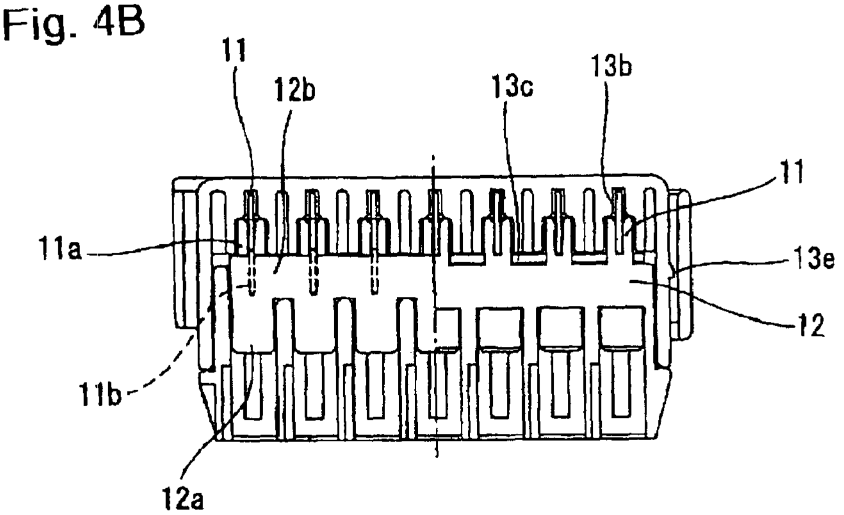
FIG. 4B is a cross sectional plan view of the assembled connector box of the present invention.
Figure 4C:
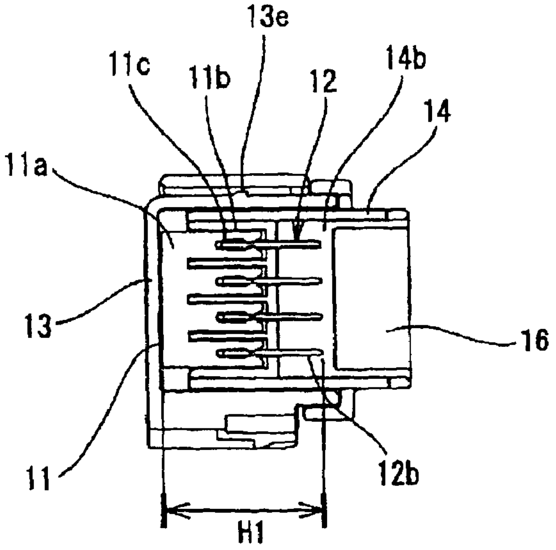
FIG. 4C is a side sectional view of the assembled connector box of the present invention.

The following will explain, with reference to FIGS. 4A–4C, the procedure through which connector box 10 is assembled.

Prior to assembly, first and second bus bars 11 and 12 are fabricated to provide the desired wiring connection pattern by separating specific portions of connector bands 11*a* and 12*a*. No separation of connector bands 11*a* and 12*a* is required in an application where all of the wires connected to connector box 10 are to be mutually joined.

Each second bus bar connector band 12*a* is then inserted into pinch slots 11*c* of each first bus bar 11, thereby forming a connection through which second bus bars 12 are frictionally clamped between first bus bar pinch prongs 11*b*, and creating a bus bar assembly.

First and second bus bars 11 and 12, which have been mutually joined in the above-described manner (i.e., the bus bar assembly), are then placed into lower case 13 as an assembled structure in which first bus bar insert part 11*f* frictionally enters X-axis slots 13*b*, and second bus bar connector band 12*a* frictionally enters Y-axis slots 13*c* in lower case 13. Moreover, in other embodiments, second bus bar 12 may also be attached to first bus bar 11 after first bus bar 11 has been fixedly installed within lower case 13.

Upper case 14 is then inserted into lower case 13 and locked therein (i.e., the upper case is assembled over the lower case to form the case housing). At this point, second bus bar terminals 12*b* are aligned in parallel within each vertically aligned plug-in aperture 14*b* in upper case 14.

With connector box 10 assembled as described above, connector terminals 15, to which the ends of circuit connecting wires 'w' have been attached, are inserted and anchored within plug-in block 16. It is apparent to those skilled in the art that the circuit connecting wires need not be previously inserted within the same plug-in block 16.

Plug-in blocks 16 are then inserted and anchored within each connector plug-in aperture 14*b*. With plug-in blocks 16 thus installed to connector box 10, connector terminals 15 join to second terminals 12*b*, thus forming a connection between the wires in the required circuit connection pattern. While the illustrated embodiment shows female connector terminals 15 and male (spade) second terminals, it is appreciable by those skilled in the art that in alternative embodiments, the connector terminals may be male and the second terminals may be female.

This structure offers a simple method of connecting multiple circuits through the installation of plug-in blocks 16 to upper case 14. Moreover, changing the locations of the separators on first and second bus bars 11 and 12 is all that is required to alter the circuit connection pattern, thus largely eliminating the need to change the wires in the plug-in blocks. Moreover, the wires in the plug-in blocks can be changed if the desired alteration in the circuit connection pattern cannot be accommodated by separating portions of the bus bars.

Figure 5:
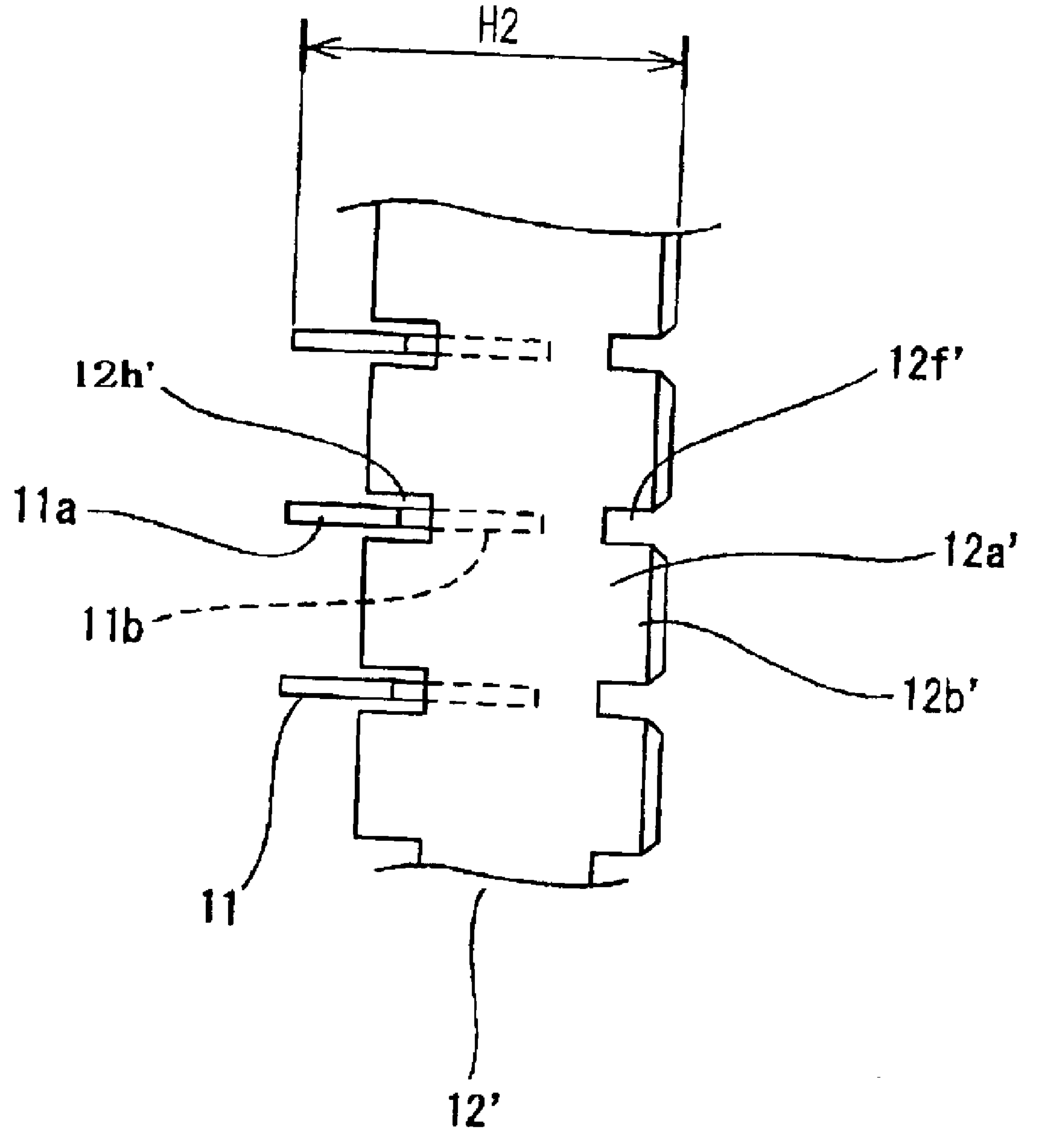
FIG. 5 is a partial plan view of a second bus bar according to a second embodiment of the present invention.
Figure 6A:
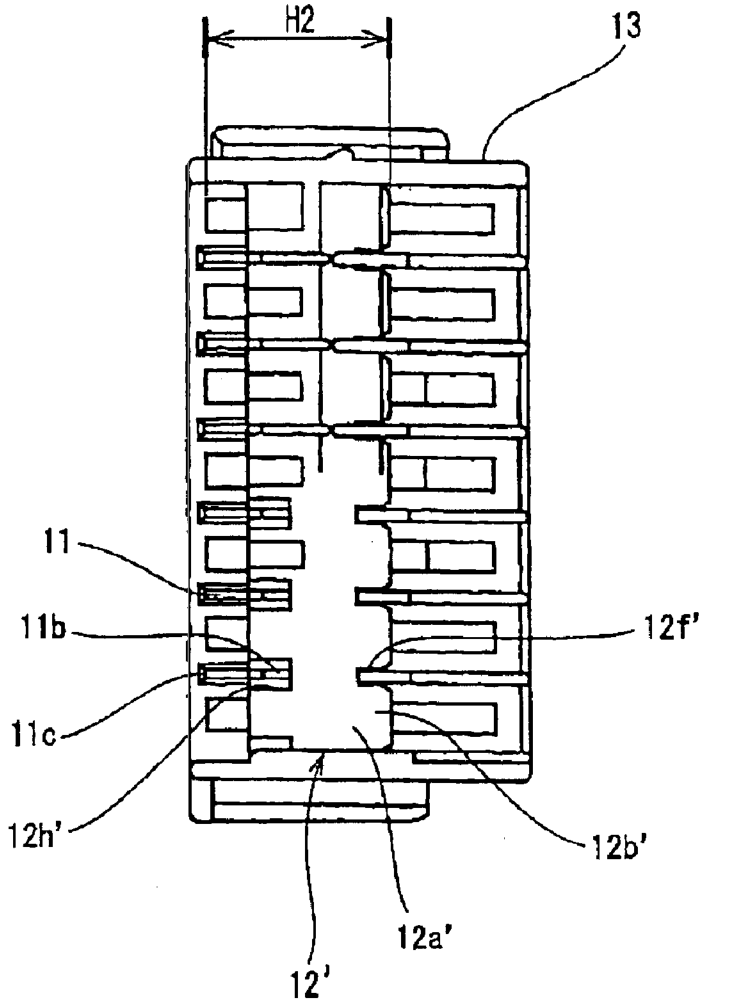
FIG. 6A is a cross-sectional plan view of the connector box according to the second embodiment of the present invention.
Figure 6B:
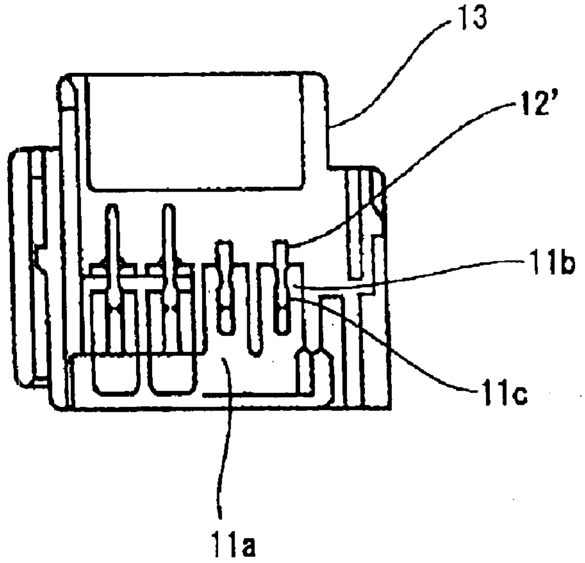
FIG. 6B is a side sectional view of the connector box according to the second embodiment of the present invention.

FIGS. 5, 6A and 6B illustrate a second embodiment of the present invention. This second embodiment allows for connector box 10 to be made to a more compact size by reducing the distance, or profile (shown as dimension H2 in the figures) from the leading edge of first bus bar 11 at the attachment point in the lower case, to the edge of second bus bar 12 at the upper case side, when first and second bus bars 11 and 12 are assembled within lower case 13 and upper case 14 (i.e., when the bus bar assembly is inside the case housing).

Slots 12*h*' are formed between connector bands 12*a*' on second bus bar 12' at locations thereon opposite to spaces 12*f* (i.e., between the vertically aligned plug-in block apertures) which are defined by adjacently located terminals 12*b*'. That is, as illustrated in FIG. 5, slots 12*h*' are cut into the connector band opposite and adjacent to each second terminal 12*b'*.

First bus bar 11 is placed opposite slots 12*h*' on second bus bar 12' in a position where first bus bar pinch prongs 11*b* can be inserted through slots 12*h*', thus forming a connection in which connector band 12*a*' is frictionally gripped within pinch slots 11*c*.

With first bus bar 11 and second bus bar 12' joined in the above-described manner, dimension H2 is smaller than dimension H1 of the first embodiment.

Figure 7:
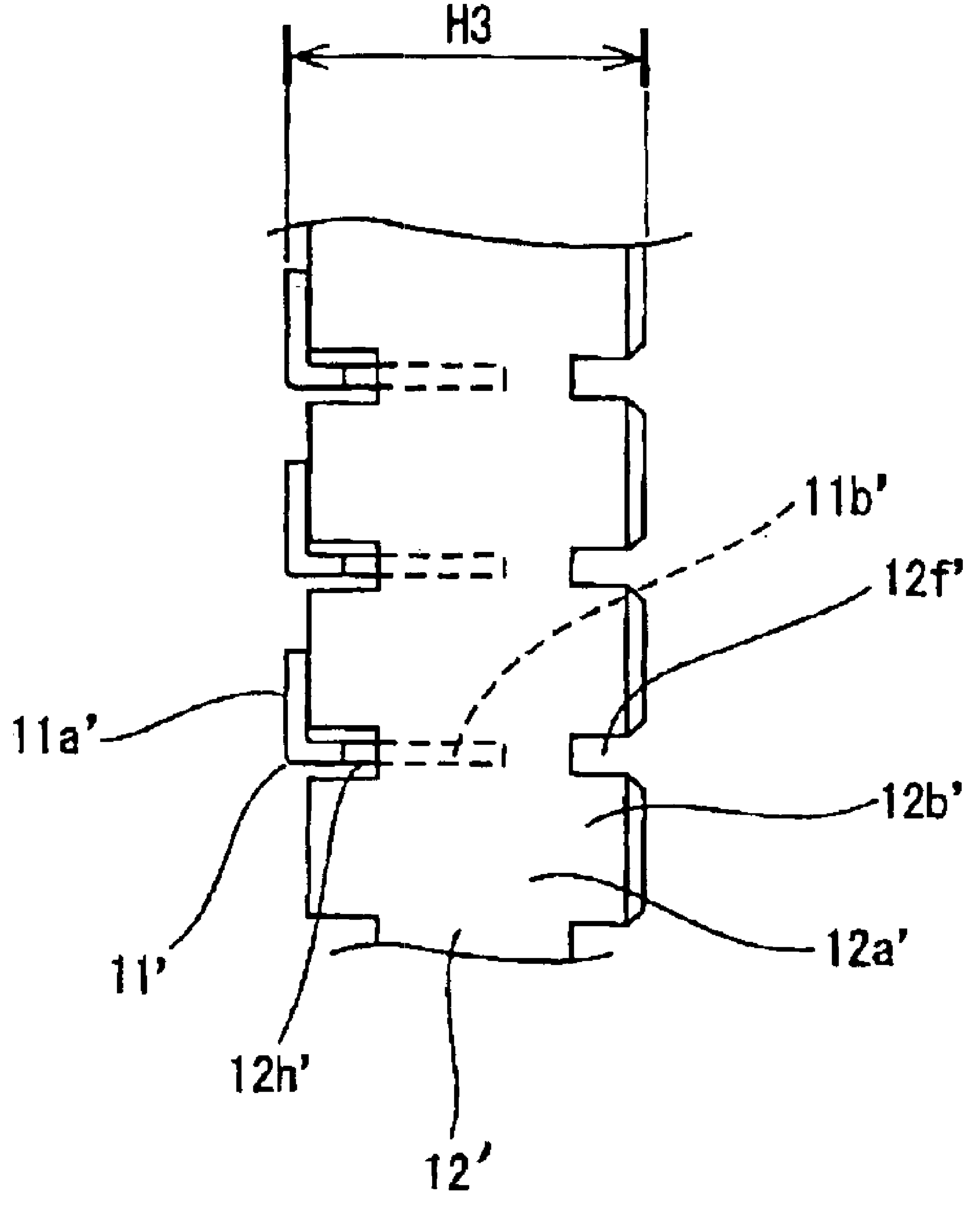
FIG. 7 is a partial plan view of a second bus bar according to a third embodiment of the present invention.
Figure 8A:
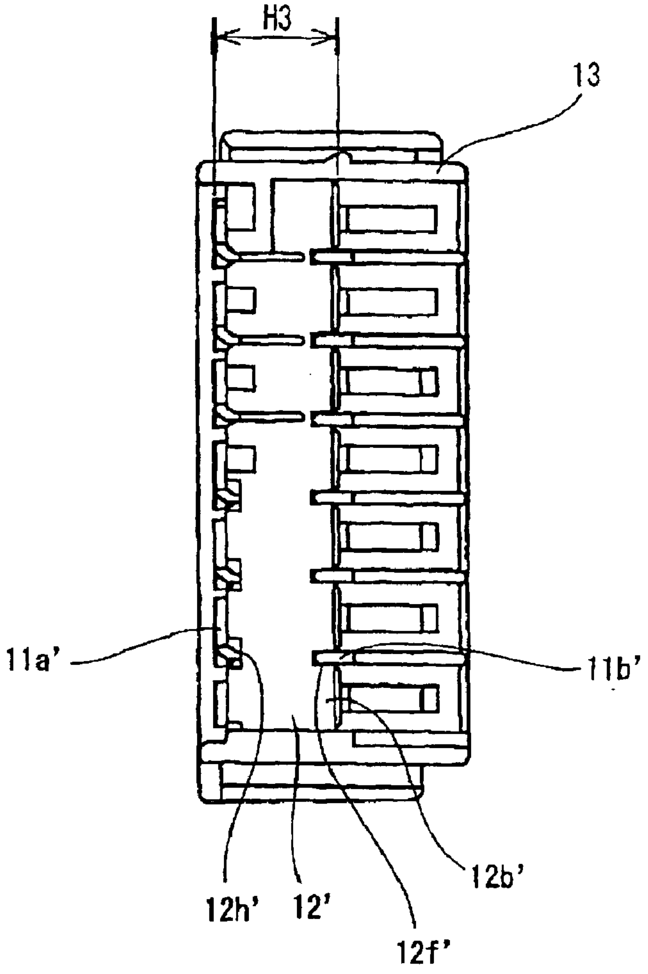
FIG. 8A is a cross-sectional plan view of the connector box according to the third embodiment of the present invention.
Figure 8B:
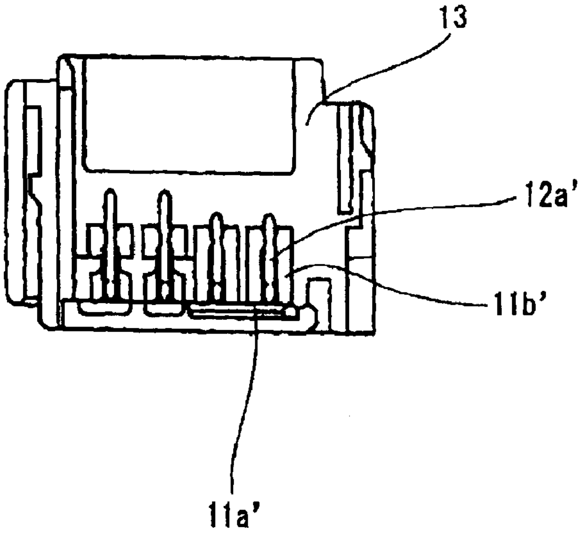
FIG. 8B is a side sectional view of the connector box according to the third embodiment of the present invention.
Figure 9:
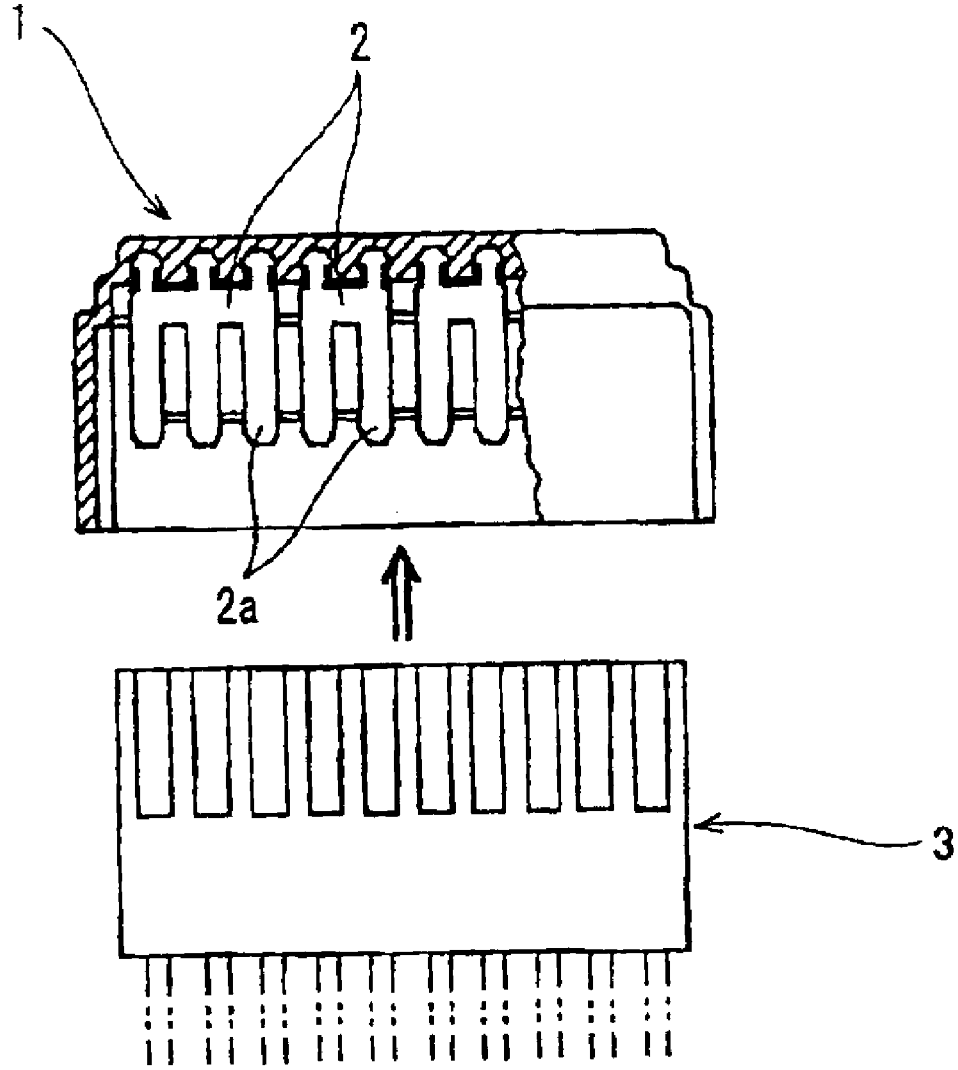
FIG. 9 shows a conventional connector box.

FIGS. 7, 8A and 8B illustrate a third embodiment of the invention in which the 'H' dimension of the connector box can be still further reduced. In this third embodiment, second bus bar 12' joins to first bus bar 11' by the frictional insertion of pinch prongs 11*b*' through slots 12*h*' in the same manner as described in the second embodiment. In this third embodiment, however, first bus bar connector band 11*a*' is bent to form a flange adjacently opposing the edge of second bus bar connector band 12*a*'. As a result, with first and second bus bars 11' and 12' connected to form the bus bar assembly, second bus bar 12' extends from first bus bar 11' a distance generally equal only to the thickness of first bus bar connector band 11*a*'. As second bus bar 12' protrudes by only such a small amount, the combined structure of the first bus bar 11' and second bus bar 12' (the bus bar assembly) has a depth dimension approximately the same as the width of second bus bar 12'. Therefore, the H3 dimension of joined first and second bus bars 11' and 12' is smaller than the corresponding H1 dimension of the first embodiment as well as the corresponding H2 dimension of the second embodiment.

Moreover, the first embodiment may also incorporate a structure in which the first bus bar connecting band is bent, as a way of reducing the 'H' dimension of the joined bus bar assembly.

As noted above, the invention puts forth a structure for an electrical connector box through which multiple circuits may be connected, thereby providing a way of allowing a single connector box to fulfill the role of multiple connector boxes heretofore required to make connections within a wiring harness. Moreover, the invention eliminates the necessity of previously installing wires at specific positions within the plug-in block, and allows wire lengths to be shortened through an easily alterable wire connection pattern. In addition, connections can be made to wires within other plug-in blocks through the simple installation of a plug-in block into the connector box, thus providing a swift and simple method of joining electrical circuits. Furthermore, the structure through which portions of the first and second bus bars can be separated allows the connector box to easily adapt to changes in circuit connection patterns.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. An electrical connector box comprising:

a plurality of first bus bars generally uniformly arranged at intervals in a Y axis direction, each of said plurality of first bus bars comprising:

a plurality of bent first connector bands;

a plurality of pairs of pinch prongs respectively extending from said first connector bands; and a plurality of first separator portions each configured to be removed from between a pair of said first connector bands;

a plurality of second bus bars generally arranged in an X axis direction, each of said second bus bars comprising:

a plurality of second connector bands configured to be frictionally inserted between a respective plurality of said pairs of pinch prongs and to form a bus bar assembly;

a plurality of second terminals respectively extending from said second connector bands; and a plurality of second separator portions each configured to be removed from between a pair of said second connector bands;

a lower case having a plurality of first lower slots formed in a floor of said lower case, said plurality of first lower slots configured to respectively accept said first bus bars; and an upper case configured to connect with said lower case, said upper case having a plurality of open plug-in apertures each configured to allow said plurality of second terminals of a respective one of said second bus bars to extend into a plug-in aperture of said plug-in apertures, said upper case and said lower case being configured to accommodate said bus bar assembly when said upper case and said lower case are connected together, wherein each of said plug-in apertures is configured to connectingly accommodate a plug-in block having a plurality of connector terminals attached to a plurality of respective ends of a respective plurality of wires such that said connector terminals respectively connect to said second terminals, and wherein said second bus bar connector bands respectively engage said first connector bands in the bus bar assembly.

2. The electrical connector box according to claim 1, wherein:

said second connector bands comprise a respective plurality of second slots respectively formed on a plurality of ends opposite said second terminals, said second slots configured to be inserted between a respective plurality of said pairs of pinch prongs and to form said bus bar assembly; and in said bus bar assembly, said pairs of pinch prongs respectively extend beyond said second slots.

3. The electrical connector box according to claim 1, wherein said lower case further has a plurality of second lower slots configured to respectively accept said second bus bars.

4. A method of assembling an electrical connector box, the method comprising:

arranging a plurality of first bus bars in a Y axis direction, each of the plurality of first bus bars having a plurality of first connector bands and a plurality of pairs of pinch prongs respectively extending from the plurality of first connector bands, removing at least one of a plurality of first separator portions from between a pair of first connector bands;

arranging a plurality of second bus bars in an X axis direction, each of the second bus bars having a plurality of second connector bands and a plurality of second terminals respectively extending from the second connector bands;

removing at least one of a plurality of second separator portions from between a pair of the second connector bands;

forming a bus bar assembly by frictionally inserting the second connector bands between a respective plurality of said pairs of pinch prongs;

inserting the first bus bars into a respective plurality of first lower slots formed in a floor of a lower case;

assembling an upper case with the lower case to form a case housing, the upper case having a plurality of open plug-in apertures, such that one of the second terminals of one of the bus bars extends into one of the plug-in apertures, the case housing accommodating the bus bar assembly; and bending the first connector bands to form bent first connector bands such that the second bus bar connector bands respectively engage the first connector bands, in the bus bar assembly.

5. The method according to claim 4, further comprising connecting a plug-in block to one of the plug-in-apertures, the plug-in block having a plurality of connector terminals attached to a plurality of respective ends of a respective plurality of wires, such that the connector terminals respectively connect to the second terminals.

6. The method according to claim 4, further comprising inserting the second bus bars into a respective plurality of second lower slots formed in the floor of the lower case.

7. The method according to claim 4, wherein forming the bus bar assembly further comprises:

inserting a respective plurality of second slots, respectively formed on a plurality of ends opposite the second terminals, between a respective plurality of the pairs of pinch prongs;

respectively extending the pairs of pinch prongs beyond the second slots.

* * * * *